United States Patent
Cooper et al.

(10) Patent No.: US 12,184,101 B2
(45) Date of Patent: *Dec. 31, 2024

(54) MULTI-CELL BATTERY MANAGEMENT DEVICE

(71) Applicant: Green Cubes Technology, LLC, Kokomo, IN (US)

(72) Inventors: Anthony Cooper, Kokomo, IN (US); Vasanth Mithilacody, Bangalore (IN)

(73) Assignee: Green Cubes Technology, LLC, Kokomo, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/144,932

(22) Filed: May 9, 2023

(65) Prior Publication Data

US 2023/0275439 A1    Aug. 31, 2023

Related U.S. Application Data

(60) Continuation of application No. 17/372,266, filed on Jul. 9, 2021, now Pat. No. 11,689,032, which is a division of application No. 16/211,084, filed on Dec. 5, 2018, now Pat. No. 11,063,445.

(60) Provisional application No. 62/594,862, filed on Dec. 5, 2017.

(51) Int. Cl.
| | |
|---|---|
| *H02J 7/00* | (2006.01) |
| *G01R 31/382* | (2019.01) |
| *G01R 31/396* | (2019.01) |
| *H01M 10/42* | (2006.01) |

(52) U.S. Cl.
CPC .......... *H02J 7/0016* (2013.01); *G01R 31/382* (2019.01); *G01R 31/396* (2019.01); *H01M 10/4207* (2013.01); *H02J 7/0047* (2013.01)

(58) Field of Classification Search
USPC ......................................................... 320/118
See application file for complete search history.

(56) References Cited

U.S. PATENT DOCUMENTS

| | | | |
|---|---|---|---|
| 10,399,461 B1 | 9/2019 | Sosinov et al. | |
| 10,926,742 B2 | 2/2021 | Lai et al. | |
| 2009/0058361 A1 | 3/2009 | John | |
| 2014/0098525 A1 | 4/2014 | Bennett | |

(Continued)

*Primary Examiner* — Bryce M Aisaka
(74) *Attorney, Agent, or Firm* — Reichel Stohry Dean LLP; Mark C. Reichel; Natalie J. Dean

(57) ABSTRACT

Multi-cell battery management devices, systems, and methods are disclosed herein. A multi-cell battery management device comprises a battery pack including a power output terminal and a plurality of battery cells each having a positive and a negative terminal and connected in series fashion. Each of the plurality of battery cells includes: i) a cell control processor to monitor cell voltage, cell current, cell temperature, and cell fuse status; ii) a programmable shunt controlled by the cell control processor that varies the internal resistance of each of the cells; and iii) a data communications circuit connected to the cell control processor and to the positive and negative terminals of each cell, the communications circuit enabling data communication over the battery cell positive and negative output terminals, and wherein the cell control processor responds to commands received via the data communications circuit to vary the operating state of the programmable shunt.

19 Claims, 3 Drawing Sheets

(56) References Cited

U.S. PATENT DOCUMENTS

| | | |
|---|---|---|
| 2014/0300311 A1 | 10/2014 | Caren |
| 2016/0181809 A1* | 6/2016 | Chiang .................. H02J 3/381 |
| | | 307/82 |
| 2016/0336623 A1 | 11/2016 | Nayar et al. |
| 2017/0005371 A1* | 1/2017 | Chidester .............. H01M 50/20 |
| 2019/0190306 A1 | 6/2019 | Sosinov et al. |
| 2020/0044467 A1 | 2/2020 | Sosinov et al. |

* cited by examiner

MULTI-CELL BATTERY MANAGEMENT DEVICE

PRIORITY

The present application is a continuation application of, and claims the priority benefit of, U.S. Non-Provisional patent application Ser. No. 17/372,266, filed Jul. 9, 2021, which is a divisional application of, and claims the priority benefit of U.S. Non-Provisional patent application Ser. No. 16/211,084, filed Dec. 5, 2018, and issued as U.S. Pat. No. 11,063,445 on Jul. 13, 2021; which is related to, and claims the priority benefit of, U.S. Provisional Patent Application Ser. No. 62/594,862, filed Dec. 5, 2017, the contents of which are incorporated into the present disclosure directly and by reference in their entirety.

BACKGROUND

Rechargeable battery packs consisting of multiple cell lithium batteries and other battery technologies are common place in today's consumer and industrial electronic devices and electric vehicles. Such battery packs can become unstable as the individual cells age and the voltage output from each cell begins to vary with respect to other cells during operation thereof. Balancing the output of individual cells would ensure safe operation of the battery system and improve the performance and life expectancy of a typical multi-cell battery pack. In such a system, each cell would be monitored by a battery management system that measures the voltage of each serial connected cell and passive or active power output control devices contained within each cell are controlled by an intelligent controller to balance cell voltage output during charging and discharging operation. In addition, it is desirable that battery pack voltage is also monitored. Elimination of wires and connections to each cell for monitoring cell electrical status would significantly reduce wiring costs and system complexity.

BRIEF SUMMARY

The present disclosure includes disclosure of a method of operating a battery management system processor to achieve voltage balancing, wherein the battery management system processor comprises a data communications circuit connected to a power output terminal of a battery pack, and wherein the battery management processor performs the following steps: i) obtaining cell voltage, cell current, cell temperature and cell fuse status data for each of a plurality of battery cells by transmitting and receiving via the data communications circuit, ii) determining desired cell output voltages based on the cell voltage, cell current, cell temperature for each of the plurality of battery cells, and iii) transmitting desired cell output voltage data to the data communications circuit of each of the plurality of battery cells using the data communications circuit of the battery management system processor.

The present disclosure also includes disclosure of the method, wherein the battery management processor further comprises a micro-processor based controller or microcontroller (MCU) that executes a computer program to monitor and control battery passive cell balancing and a control switch via a control signal.

The present disclosure also includes disclosure of the method, wherein the plurality of battery cells respond to requests from the controller to provide battery cell operating measurement data to the controller to achieve voltage balancing.

The present disclosure also includes disclosure of the method, wherein each of the plurality of battery cells further comprises a micro-controller, and wherein the controller collects periodic and repeated communication broadcasts of battery cell data received from the battery cell microcontrollers at predetermined time intervals to achieve voltage balancing.

The present disclosure also includes disclosure of the method, wherein the controller transmits shunt control data or voltage control data to micro-controllers within the battery cells, wherein each of the plurality of battery cells respond by turning on or off the resistance of cell balance shunts to adjust the operating condition of their respective battery cells and achieve cell balancing or a desired cell output voltage.

The present disclosure also includes disclosure of the method, wherein the controller operates to direct microprocessor controllers within each of the plurality of battery cells to enable or disable cell balance shunts within each of the plurality of battery cells to achieve a desired cell voltage.

The present disclosure also includes disclosure of the method, wherein the battery management system processor operates to reduce higher cell voltages to match those of the lower voltage cells in the battery pack to prevent damage.

The present disclosure also includes disclosure of the method, wherein each of a plurality of cell balance shunts has low resistance to prevent significant loss of power via resistive thermal heating.

The present disclosure also includes disclosure of the method, wherein each of the plurality of battery cells further comprises unique identification when communicating with a micro-processor based controller or microcontroller (MCU).

The present disclosure also includes disclosure of the method, wherein determining further comprises determining cell fuse status for each of the plurality of battery cells.

The present disclosure includes disclosure of a microprocessor-based battery management system, comprising: a multi-cell battery pack having a plurality of battery cells therein; and a microcontroller in communication with each of the plurality of battery cells therein for controlling an operating state of each cell of the plurality of battery cells in communication with programmable cell balance shunts controlled by microprocessor controllers within each of the plurality of battery cells.

The present disclosure also includes disclosure of the system, further comprising a data communications circuit to vary the operating state of each of the plurality of battery cells.

The present disclosure also includes disclosure of the system, wherein the programmable cell balance shunts vary internal resistance of each of the plurality of battery cells.

The present disclosure includes disclosure of a multi-cell battery management system, comprising: a multi-cell battery pack having a microcontroller in communication with a plurality of battery cells, wherein the multi-cell battery pack comprises: a cell control processor to monitor cell voltage; a programmable cell balance shunt controlled by the cell control processor to vary internal resistance of each of the plurality of battery cells; and a data communications circuit in communication with the cell control processor; wherein the cell control processor responds to commands received via the data communications circuit to vary an internal operating state of the programmable cell balance shunt.

BRIEF DESCRIPTION OF THE DRAWINGS

The disclosed embodiments and other features, advantages, and disclosures contained herein, and the matter of attaining them, will become apparent and the present disclosure will be better understood by reference to the following description of various exemplary embodiments of the present disclosure taken in conjunction with the accompanying drawings, wherein.

Figure 1:
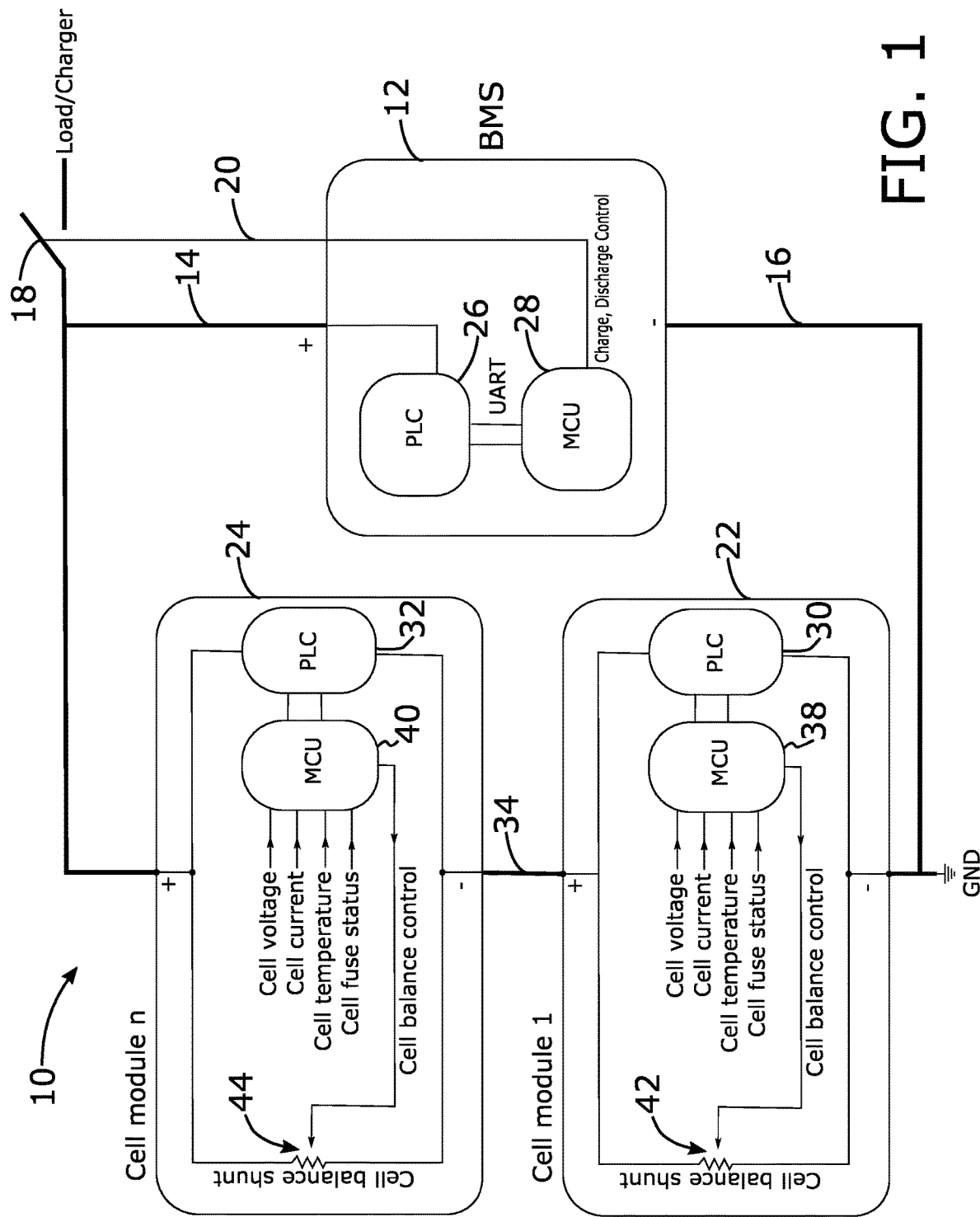
FIG. 1 shows a diagrammatic illustration of a multi-cell battery management device 10, according to an exemplary embodiment of the present disclosure.

An overview of the features, functions and/or configurations of the components depicted in the various figures will now be presented. It should be appreciated that not all of the features of the components of the figures are necessarily described. Some of these non-discussed features, such as various couplers, etc., as well as discussed features are inherent from the FIGS. themselves. Other non-discussed features may be inherent in component geometry and/or configuration.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

Figure 2:
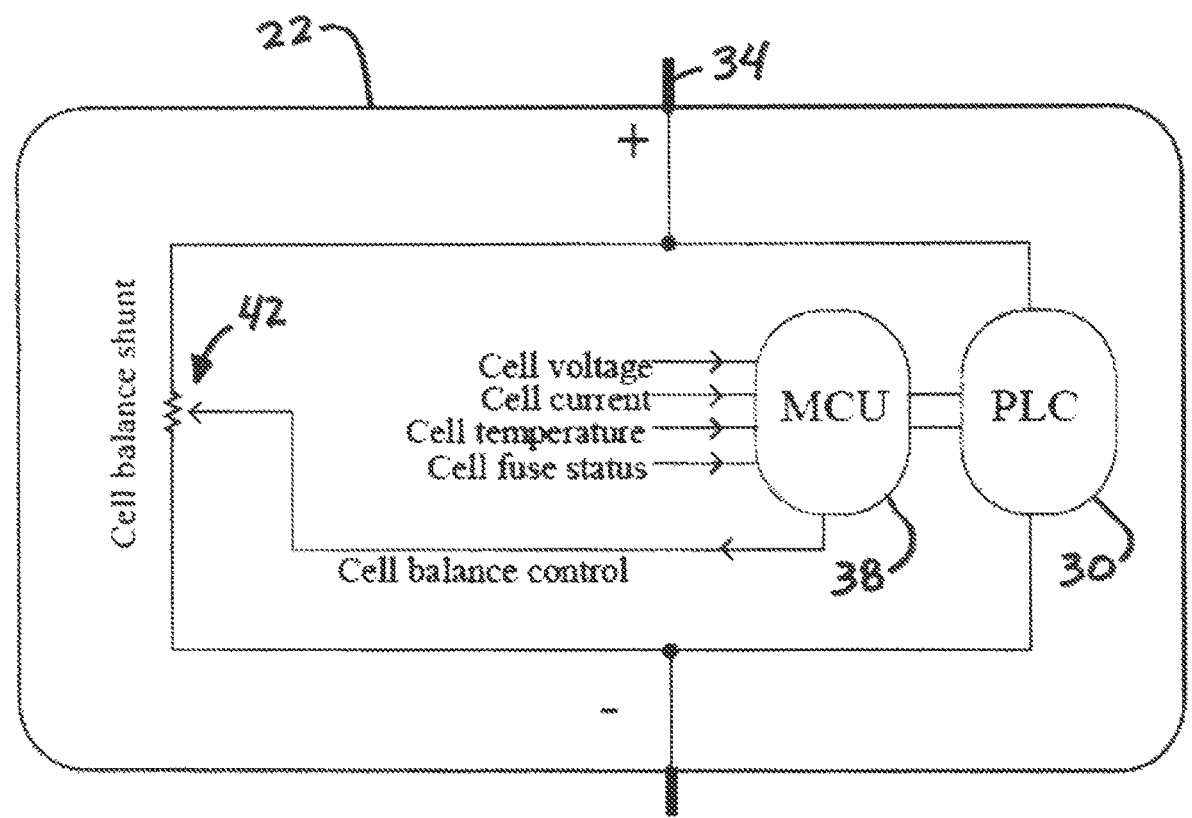
FIG. 2 shows an enlarged view of cell module 22 of FIG. 1, according to an exemplary embodiment of the present disclosure.

An exemplary device for multi-cell battery management device 10 of the present disclosure is shown in FIGS. 1 and 2. As shown in FIG. 1, device 10 includes a microprocessor based battery management system 12 electrically connected to a positive terminal 14 and a negative terminal 16 of a multi-cell battery consisting of cells 22 and 24. Cells 22 and 24 are identical in construction and representative of a typical multi-cell battery that may include additional cells "n" as is needed to produce a desired DC output voltage on terminal 14. FIG. 2 is an enlarged view of cell 22 shown in FIG. 1 and is representative of the components of each battery cell.

Battery management system controller 12 includes a microprocessor based controller or microcontroller 28 (MCU) that executes a computer program to monitor and control battery passive cell balancing and control switch 18 via control signal 20. Switch 18 is representative of a power switching electronic device or alternatively a set of relay contacts where the signal present on signal path 20 controls the open/closed state of control switch 18. Controller 12 includes a power line communications integrated circuit (PLC) 26 that enables MCU 28 to communicate with a microcontroller present in each of cells 22 and 24 over battery power wire 14. PLC 26 includes a universal asynchronous receiver transmitter (UART) interface that is connected to digital inputs and outputs of MCU 28. PLC 26 provides a serial data communications interface for MCU 28 to communicate with corresponding PLC devices 30 and 32 of cells 22 and 24, respectively, over battery cell connection wires 14 and 34. MCUs 38 and 40 communicate with MCU 28 via PLCs 30 and 32. PLC devices 30 and 32 are identical to PLC 26 and provide a serial data communications interface for MCUs 38 and 40 to exchange data with MCU 28 over power wires 14 and 34 of the battery.

MCU devices 28, 38 and 40 include typical microcontroller features, specifically a microprocessor, program memory or ROM, random access memory or RAM, and digital and analog input/output (I/O) capabilities. Each cell MCU (devices 38 and 40) monitors battery operating conditions such as cell voltage, cell current, cell temperature and cell fuse status via I/O circuitry. Such I/O devices are well known in the electronics art. Further, each cell module includes a computer controlled cell balance shunt (devices 42 and 44) controlled by the respective MCUs (38 and 40) of each cell. Cell balance shunt 42 and 44 include circuit components used to control cell output voltage by varying the resistance of shunts 42 and 44. It is contemplated that the resistance of shunts 42 and 44 will be low to prevent significant loss of power via resistive thermal heating. Either ON/OFF or PWM controlled balancing can be used based on the requirement.

Figure 3:
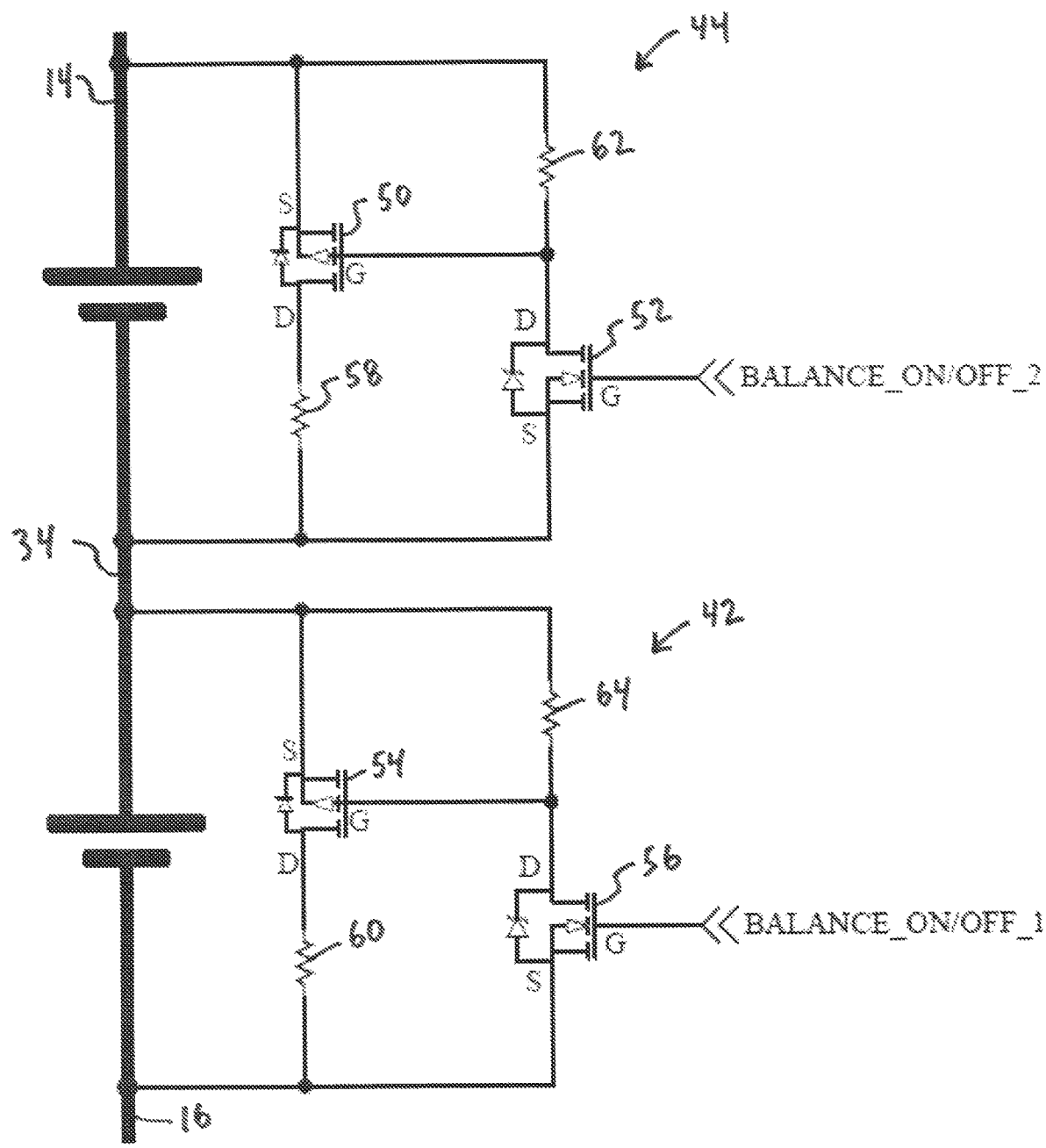
FIG. 3 is a schematic diagram of the circuit components of the programmable cell balance shunts 42 and 44 of FIG. 1 according to an exemplary embodiment of the present disclosure.

Referring now to FIG. 3, a schematic circuit diagram for cells 22 and 24 is shown depicting cell balance shunt circuits 42 and 44 contained therein, respectively. Each cell 22 and 24 of system 10 contains two enhancement mode n-channel and p-channel MOSFET transistors used as electronic switches in the present design. Transistors 50 and 52 are situated in cell 44 and transistors 54 and 56 are situated within cell 42. Resistors 58 and 60 are shunt resistors and resistors 62 and 64 are voltage "pullup" resistors. Gate (G) of transistor 52 is connected to a digital output of MCU 40 and gate (G) of transistor 56 is connected to a digital output of MCU 38. A logic high level voltage at gate (G) of an n-channel MOSFET will turn the device fully "on" reducing the resistance from drain (D) to source (S) to near zero ohms and enabling current to flow from drain (D) to source (S). Pullup resistors 62 and 64 are relatively high in resistance and serve to maintain a logic high voltage at gate (G) of transistors 50 and 54 when transistors 52 and 56 are not turned on, i.e., the gate signal at transistors 52 and 56 is logic low. A logic low signal is normally present when no cell balancing is required at gate (G) of both transistors 52 and 56. When transistors 52 and 56 are "on", gates (G) of transistors 50 and 54 are pulled low turning transistors 50 and 54 "on" and connecting shunt resistors 58 and 60 across cells 22 and 24. If cell balancing is determined necessary, such as the condition where the output voltage of cell 24 is greater than the output voltage of cell 22, MCU 40 will apply a logic high signal to gate (G) of transistor 52 resulting in a logic low voltage at gate (G) of transistor 50 turning transistor 50 "on" and a near zero resistance is then present between the drain (D) and source (S) of transistor 50 and the resistance of resistor 58 is connected across signal paths 14 and 34. Balance current depends upon cell voltage and the resistance of the resistor 58. The cell balancing continues to be active as long as the cell 22 voltage is almost equal cell voltages of 24. Conversely, if the output voltage of cell 22 is greater than that of cell 24 and load balancing is determined necessary, MCU 38 applies a logic high to gate (G) of transistor 56, which results in a logic low at gate (G) of transistor 54 applying the resistance of resistor 60 to the output voltage of cell 22 in parallel with signal paths 34 and 16.

It should be apparent that additional shunt circuits arranged in parallel with the above described circuits could be implemented to provide a variety of shunt resistances across the cell output terminals thereby enhancing the operation of the present cell voltage balancing invention.

Battery management device 10 operates as follows. Microcontroller 28 of battery management system controller 12 communicates with microcontrollers 38 and 40 over wires 14 and 34 by way of power line communications devices 26, 30 and 32. Cell modules 22 and 24 may operate in one of two modes, a first mode includes responding to requests from controller 12 to provide cell operating measurement data to controller 12 such as cell voltage, cell current, cell temperature and cell fuse state. Alternatively, a second mode of collecting data from cell modules 22 and 24 would include periodic and repeated communication broadcasts of battery cell data by controllers 38 and 40 over power signal lines 34 and 14 to controller 12 at predetermined time intervals via PLC devices 26, 30 and 32. Controller 12 monitors the data collected from cells 22 and 24 and determines whether cell balancing is required based upon predetermined voltage thresholds. Controller 12 transmits shunt control data or voltage control data to controllers 38 and 40, which in turn, respond by turning on/off the resistance of shunts 42 and 44 to adjust the operating condition of their respective battery cells 22 and 24 and achieve cell balancing or a desired cell output voltage in accordance with the description of operation of the circuits shown in FIG. 3. The objective being to reduce higher cell voltages to match those of the lower voltage cells in the battery pack. Controller 12 may either direct controllers 38 and 40 to enable or disable shunts 42 and 44, respectively, to achieve a desired cell voltage, or controller 12 may communicate precise shunt settings to controllers 38 and 40, either operation of which will be successful in voltage balancing. Precise shunt settings are contemplated where the circuits shown in FIG. 3 are implemented with multiple switching circuits as shown in FIG. 3 for each cell resulting in multiple shunt resistances available in each cell.

Controller 12 also monitors total battery voltage and current flow between signal paths 14 and 16 via communications with controllers 38 and 40. If an operating condition is sensed by controller 12 that is undesirable or dangerous, controller 12 responds by disengaging battery wire 14 from a load or charger (not shown) by opening switch 18 to disconnect battery wire 14 from the load or battery charger circuit and thereby preventing dangerous or device damaging operating conditions.

PLC devices 26, 30 and 32 are commercially available IC devices. Such products are manufactured by a number of suppliers including ST Microelectronics, Atmel, Texas Instruments and Yamar Electronics, Ltd. One particular device that is suitable for use in the present invention is the SIG60 UART device manufactured by Yamar Electronics, Ltd. which is adapted for use in AC or DC power systems to provide serial data communications over battery power lines. Further information including a detailed data sheet for the SIG60 IC may be found at the web site WWW.YAMAR.COM and is herein incorporated by reference.

It is contemplated that each cell module 22 and 24 may require unique identification when communicating with the battery management system controller 12. Specifically, when communicating with a particular cell module, controller 12 includes a cell module identifier when transmitting serial data commands over the power bus to the cell modules. Unique identifiers transmitted via serial data streams are easily established in software by use of a unique numerical value, or in hardware by pulling digital inputs of the MCUs 38 and 40 to a unique logic high or low state via simple pull-up and pull-down resistor circuits. Where each MCU includes a unique identifier assigned via hardware or software, each data stream transmitted by the MCU would include the unique identifier value as a message source or "cell module" identifier.

While various embodiments of devices for multi-cell battery management and methods for multi-cell battery management have been described in considerable detail herein, the embodiments are merely offered as non-limiting examples of the disclosure described herein. It will therefore be understood that various changes and modifications may be made, and equivalents may be substituted for elements thereof, without departing from the scope of the present disclosure. The present disclosure is not intended to be exhaustive or limiting with respect to the content thereof.

Further, in describing representative embodiments, the present disclosure may have presented a method and/or a process as a particular sequence of steps. However, to the extent that the method or process does not rely on the particular order of steps set forth therein, the method or process should not be limited to the particular sequence of steps described, as other sequences of steps may be possible. Therefore, the particular order of the steps disclosed herein should not be construed as limitations of the present disclosure. In addition, disclosure directed to a method and/or process should not be limited to the performance of their steps in the order written. Such sequences may be varied and still remain within the scope of the present disclosure.

The invention claimed is:

1. A multi-cell battery pack, comprising:
a plurality of battery cells, wherein each of the plurality of battery cells comprises a cell balance shunt used to control cell output voltage, and wherein each of the plurality of battery cells is in communication with a battery management system controller;
wherein the battery management system controller monitors a battery operating condition of at least one of the plurality of battery cells; and
a shunt control data or voltage control data transmitted from the battery management system controller to the at least one of the plurality of battery cells;
wherein an output voltage of the at least one of the plurality of battery cells is adjusted in response to receiving the shunt control data or voltage control data;
wherein the output voltage is adjusted by varying a resistance of the cell balance shunt.

2. The multi-cell battery pack of claim 1, wherein the at least one of the plurality of cells comprises additional shunt circuits, which provide a variety of shunt resistances.

3. The multi-cell battery pack of claim 2, wherein a precise shunt setting is transmitted from the battery management system controller to the at least one of the plurality of battery cells to achieve a precise shunt setting.

4. The multi-cell battery pack of claim 1, wherein each of the plurality of battery cells and the battery management system controller are connected via a battery power wire and communicate over the battery power wire.

5. The multi-cell battery pack of claim 1, wherein a resistance of the cell balance shunts is low to prevent significant loss of power via resistive thermal heating.

6. The multi-cell battery pack of claim 1, wherein the shunt control data or voltage control data is an ON/OFF signal.

7. The multi-cell battery pack of claim 1, wherein the shunt control data or voltage control data is a pulse width modulated signal.

8. The multi-cell battery pack of claim 1, wherein the battery management system controller also monitors a total battery voltage of the multi-cell battery pack and monitors a current flow between each of the plurality of battery cells, and wherein the battery management system controller may disconnect a battery power wire from a load or charger to prevent dangerous or device damaging operating conditions.

9. The multi-cell battery pack of claim 1, wherein each of the plurality of battery cells comprises a unique identifier and the shunt control data or voltage control data comprises the unique identifier of the at least one of the plurality of battery cells.

10. A method of adjusting the voltage of a battery cell in a multi-cell battery pack comprising the steps of:
    monitoring a battery cell operating condition of at least one battery cell at a battery management system controller;
    determining that cell balancing is required based on the battery cell operating condition;
    transmitting a shunt control data or voltage control data to the at least one battery cell; and
    adjusting a resistance of a cell balance shunt in the at least one battery cell to adjust an output voltage of the at least one battery cell.

11. The method of adjusting the voltage of a battery cell in a multi-cell battery pack of claim 10, further comprising the steps of:
    receiving the battery cell operating condition from the at least one battery cell over a battery power wire.

12. The method of adjusting the voltage of a battery cell in a multi-cell battery pack of claim 10, further comprising the steps of: wherein the step of determining that cell balancing is required is performed based on a predetermined voltage value.

13. The method of adjusting the voltage of a battery cell in a multi-cell battery pack of claim 10, wherein the step of adjusting a resistance of a cell balance shunt further comprises the steps of adjusting a resistance of an additional cell balance shunt to adjust the output voltage of the at least one battery cell.

14. The method of adjusting the voltage of a battery cell in a multi-cell battery pack of claim 10, wherein the shunt control data or voltage control data is an ON/OFF signal.

15. The method of adjusting the voltage of a battery cell in a multi-cell battery pack of claim 10, wherein the shunt control data or voltage control data is a pulse width modulated signal.

16. The method of adjusting the voltage of a battery cell in a multi-cell battery pack of claim 10, wherein the step of adjusting a resistance of a cell shunt adjusts the output voltage of the at least one battery cell to almost equal an output voltage of a second battery cell.

17. The method of adjusting the voltage of a battery cell in a multi-cell battery pack of claim 16, further comprising the step of:
    maintaining the adjustment of the resistance of the cell balance shunt as long as the output voltage of the at least one battery cell is almost equal to the output voltage of the second battery cell.

18. The method of adjusting the voltage of a battery cell in a multi-cell battery pack of claim 10, further comprising the steps of:
    monitoring total battery voltage and current flow;
    sensing a battery operating condition that is undesirable or dangerous; and
    disengaging the multi-cell pack from a load or charger, thereby preventing dangerous or device damaging operating conditions.

19. The method of adjusting the voltage of a battery cell in a multi-cell battery pack of claim 10, further comprising the step of transmitting the a shunt control data or voltage control data at a unique logic high or low state so that it is received by a specific cell of the at least one battery cell.

* * * * *